(12) United States Patent
Lee

(10) Patent No.: US 11,805,604 B2
(45) Date of Patent: Oct. 31, 2023

(54) DISPLAY DEVICE

(71) Applicant: SAMSUNG DISPLAY CO., LTD., Yongin-si (KR)

(72) Inventor: Ji Heon Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 10 days.

(21) Appl. No.: 17/353,553

(22) Filed: Jun. 21, 2021

(65) Prior Publication Data

US 2022/0132689 A1 Apr. 28, 2022

(30) Foreign Application Priority Data

Oct. 27, 2020 (KR) .................. 10-2020-0140414

(51) Int. Cl.
  *H05K 5/02* (2006.01)
  *G06F 1/16* (2006.01)
  *H05K 5/00* (2006.01)

(52) U.S. Cl.
  CPC ......... *H05K 5/0217* (2013.01); *G06F 1/1641* (2013.01); *H05K 5/0017* (2013.01)

(58) Field of Classification Search
  CPC .. H05K 5/0217; H05K 5/0017; G06F 1/1641; G06F 1/1616; G06F 1/1618; G06F 1/1681; G06F 1/1624; H04M 1/0268; H04M 1/0214
  See application file for complete search history.

(56) References Cited

U.S. PATENT DOCUMENTS

| | | | | |
|---|---|---|---|---|
| 9,173,288 | B1* | 10/2015 | Kim | G06F 1/1681 |
| 9,348,362 | B2* | 5/2016 | Ko | G06F 1/1601 |
| 9,791,892 | B2* | 10/2017 | Park | G06F 1/1635 |
| 9,844,251 | B2* | 12/2017 | Lin | G06F 1/1652 |
| 10,209,746 | B2 | 2/2019 | Baek | |
| 10,474,196 | B2* | 11/2019 | Yeh | G06F 1/1681 |
| 10,520,992 | B1* | 12/2019 | Chang | G06F 1/1616 |
| 10,694,623 | B2 | 6/2020 | Park | |
| 11,044,825 | B1* | 6/2021 | Han | H05K 5/0017 |
| 11,240,920 | B2* | 2/2022 | Jeon | H05K 5/0217 |
| 11,353,934 | B2* | 6/2022 | Mehandjiysky | G06F 1/1681 |
| 2014/0111954 | A1* | 4/2014 | Lee | H05K 1/028 361/749 |
| 2017/0290179 | A1* | 10/2017 | Zhang | H05K 5/0217 |
| 2018/0213663 | A1* | 7/2018 | Lin | F16C 11/04 |
| 2019/0075669 | A1 | 3/2019 | Heng | |
| 2019/0132974 | A1 | 5/2019 | Chen | |

(Continued)

FOREIGN PATENT DOCUMENTS

| | | |
|---|---|---|
| KR | 10-2004-0059817 | 7/2004 |
| KR | 10-2017-0052474 | 5/2017 |
| KR | 10-2017-0057500 | 5/2017 |

*Primary Examiner* — Sagar Shrestha
(74) *Attorney, Agent, or Firm* — H.C. Park & Associates, PLC

(57) ABSTRACT

A display device includes: a display panel; a first support disposed on the display panel and including a housing, a movable part supported for slidable movement relative to the housing, and an elastic part having one side supported by the housing to press the movable part, and a body disposed on the first support and including an inner space overlapping the first support and a second support disposed in the inner space and supporting one side of the movable part.

17 Claims, 10 Drawing Sheets

(56) References Cited

U.S. PATENT DOCUMENTS

| | | | |
|---|---|---|---|
| 2019/0306290 A1* | 10/2019 | Lee | H04M 1/0216 |
| 2020/0170127 A1* | 5/2020 | Kim | H05K 5/0226 |
| 2020/0253068 A1* | 8/2020 | Cha | H05K 5/0226 |
| 2020/0253069 A1* | 8/2020 | Cha | G06F 1/1681 |
| 2021/0223820 A1* | 7/2021 | Yoo | G06F 1/1677 |
| 2021/0360799 A1* | 11/2021 | Jia | H05K 5/0017 |
| 2021/0365074 A1* | 11/2021 | Mehandjiysky | G06F 1/1652 |

* cited by examiner

SP: PLT, CP
CM: CMB, CA, CA_H, MP, EM

DISPLAY DEVICE

CROSS REFERENCE TO RELATED APPLICATION

This application claims priority from and the benefit of Korean Patent Application No. 10-2020-0140414, filed on Oct. 27, 2020, which is hereby incorporated by reference for all purposes as if fully set forth herein.

BACKGROUND

Field

Embodiments of the invention relate generally to a display device and, more specifically, to a foldable display device.

Discussion of the Background

With the development of multimedia, the importance of display devices is increasing. Accordingly, various kinds of display devices such as organic light-emitting diode (OLED) displays and liquid crystal displays (LCDs) are being used.

Recently, foldable display devices having flexible display panels are being developed. The foldable display device has a foldable and unfoldable structure, and a large screen may be provided for use.

The above information disclosed in this Background section is only for understanding of the background of the inventive concepts, and, therefore, it may contain information that does not constitute prior art.

SUMMARY

Applicant realized that folding creases may be generated in a flexible display panel due to repeated folding.

Display devices constructed according to the principles and illustrative implementations of the invention reduce the occurrence of folding creases generated due to repeated folding operations.

Additional features of the inventive concepts will be set forth in the description which follows, and in part will be apparent from the description, or may be learned by practice of the inventive concepts.

According to one aspect of the invention, a display device includes: a display panel; a first support disposed on the display panel and including a housing, a movable part supported for slidable movement relative to the housing, and an elastic part having one side supported by the housing to press the movable part, and a body disposed on the first support and including an inner space overlapping the first support and a second support disposed in the inner space and supporting one side of the movable part.

The first support may include a first support plate and the housing may include a plurality of housings disposed at corners of the first support.

When the display panel is folded, the movable part may slidably move with respect to the housing in a direction intersecting the thickness direction of the display device.

The movable part may include a movable member having a substantially cylindrically-shaped portion and a stopper part extending from the substantially cylindrically-shape portion.

The elastic part may include an elastic member: the housing may include a protrusion including an inner space accommodating the elastic part and an inner side surface surrounding the inner space; the one side of the elastic part may be supported by the inner side surface of the protrusion; and the other side of the elastic member is supported by the stopper part.

The second support may include a second support part and the movable part may include a movable member: the one side of the movable part may extend from the housing toward the second support part; and when the display panel is folded, a length of the one side of the movable member protruding from the housing increases or decreases.

A cover frame may overlap the inner space of the body.

The body may include a body frame and the cover frame may include a generally flat part interposed between the first support and the second support; and a bent part connected to the generally flat part and bent to form an opening accommodating the housing between the cover frame and the body frame.

The housing may be received through the opening in the inner space of the body frame.

A coupling hole may be formed through the second support and the generally flat part.

The first support may include a support plate and may be in direct contact with the cover frame.

When the display panel is folded, the support plate may slidably move with respect to the cover frame.

The elastic part may include an elastic member that may be compressible by the movable part to provide a restorative force to elongate the first support.

When the display panel is folded, a length of the elastic part may be changed.

The elastic part may be compressed when the display panel is folded; and the elastic part may be elongated when the display panel is unfolded.

A bezel member may be disposed at least partially on an edge of the display panel.

When the display panel is folded, a gap may be formed between the display panel and the body; and the gap may be covered by the bezel member.

According to another aspect of the invention, a display device includes a display module including a display panel and a plurality of couplers overlapping corners of the display panel, and a foldable part disposed on the display module and including a plurality of support parts in contact with the plurality of couplers, wherein the plurality of couplers press the plurality of support parts to apply a tensile force to the display panel.

At least one of the plurality of couplers may include a housing, a movable part supported for slidable movement relative to the housing, and an elastic part having one side supported by the housing and pressing the movable part; one side of the movable part may be supported by one of the plurality of support parts.

The foldable part may include a foldable member and the display module may be slidably coupled to the foldable member for movement relative to the foldable member when the display panel is folded It is to be understood that both the foregoing general description and the following detailed description are exemplary illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary illustrative embodiments of the invention, and together with the description serve to explain the inventive concepts.

DETAILED DESCRIPTION

Figure 1:
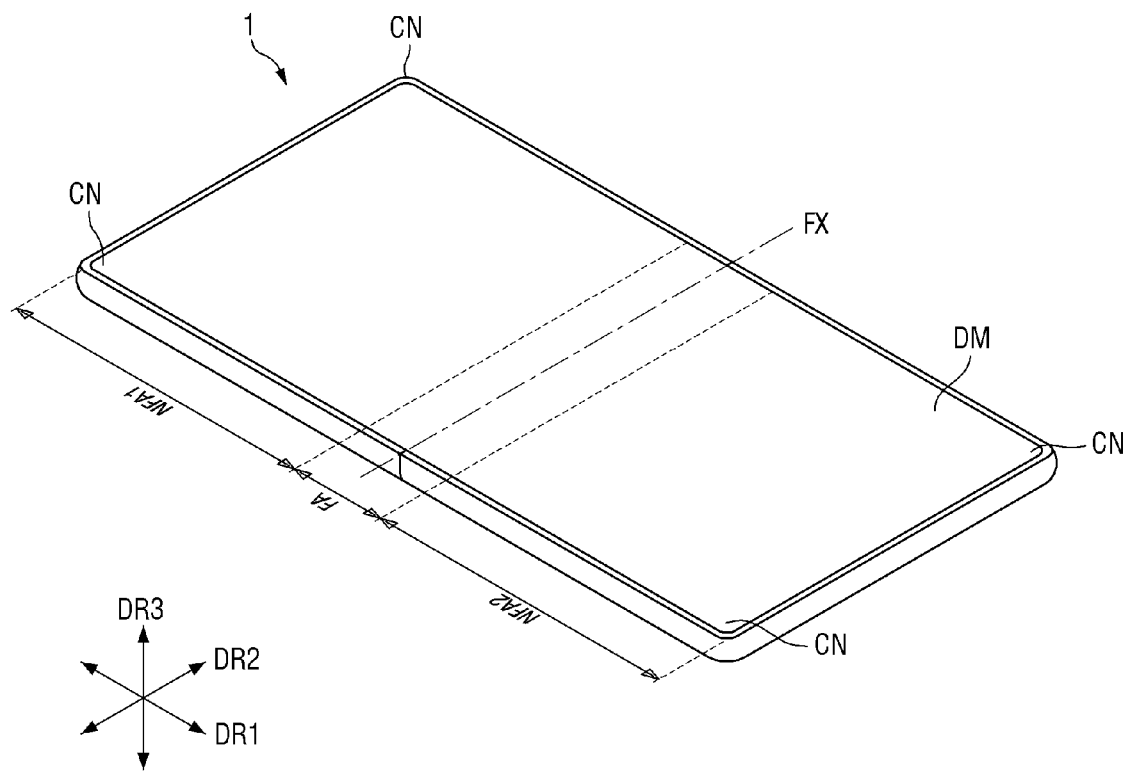
FIG. 1 is a perspective view illustrating an embodiment of a display device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. Furthermore, as used herein, a first direction DR1, a second direction DR2, and a third direction DR3 intersect each other in different directions. For example, the first direction DR1 may be a width direction, the second direction DR2 may be a longitudinal direction, and the third direction DR3 may be a height direction (thickness direction). Each of the first direction DR1, the second direction DR2, and the third direction DR3 may include two or more directions. For example, the third direction DR3 may include an upward direction and a downward direction. In this case, one surface, which faces in the upward direction, of a member may be referred to as an upper surface thereof and the other surface, which faces in the downward direction, of the member may be referred to as a lower surface. However, the directions are only exemplary and relative and are not limited thereto. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
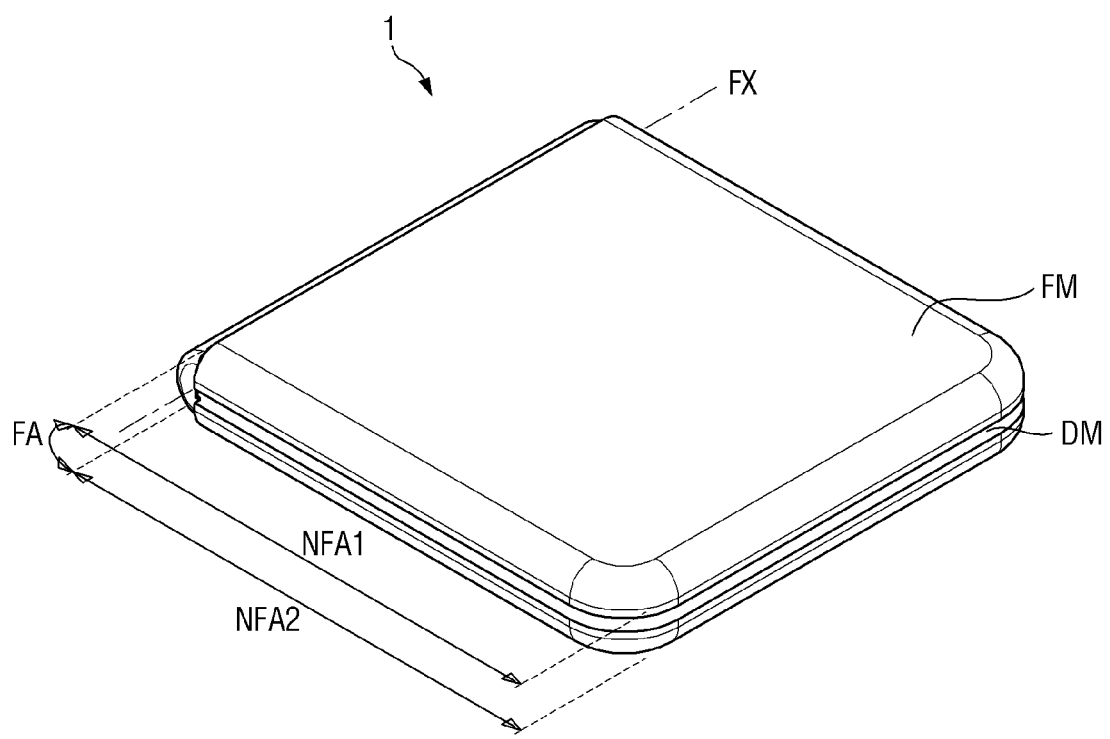
FIG. 2 is a perspective view illustrating a folded position of the display device of FIG. 1.
Figure 2:
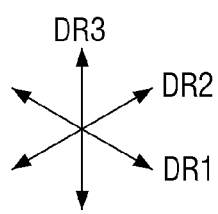
Figure 3:
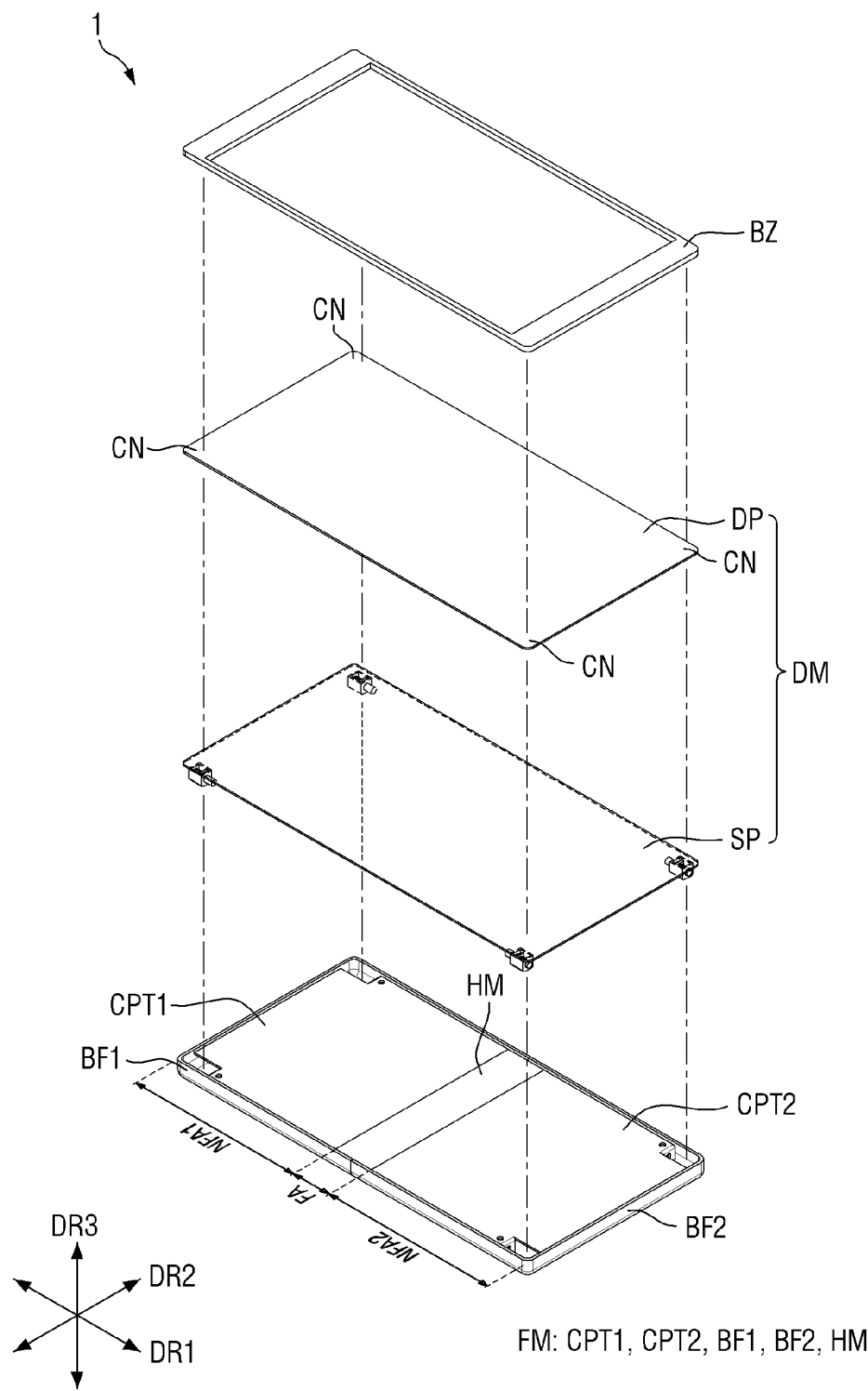
FIG. 3 is an exploded perspective view illustrating the display device of FIG. 1.

FIG. 1 is a perspective view illustrating an embodiment of a display device constructed according to the principles of the invention. FIG. 2 is a perspective view illustrating a folded position of the display device of FIG. 1. FIG. 3 is an exploded perspective view illustrating the display device of FIG. 1.

Referring to FIG. 1, a display device 1 may include one of various devices configured to display screens or images. The display device 1 may include or take the form of, for example, a smartphone, a mobile phone, a tablet personal computer (PC), a personal digital assistant (PDA), a portable multimedia player (PMP), a television set, a game machine, a wrist watch type electronic device, a head mounted display, a monitor of a PC, a notebook computer, a car navigation system, a dashboard, a digital camera, a camcorder, an outdoor billboard, an electronic sign, various medical devices, various inspection devices, various home appliances including display areas (DPAs), such as a refrigerator and a washing machine, and the Internet of Things device but is not limited thereto.

The display device 1 may have a generally rectangular shape having two short sides in the first direction DR1, two long sides in the second direction DR2, and four corners CN when viewed from above. However, the shape of the display device 1 is not limited thereto, and the display device 1 may have one of various shapes such as a generally square shape, a generally round shape, and a generally rhombus shape.

Referring to FIGS. 1 and 2, the display device 1 may be a foldable device which is foldable and unfoldable. For example, the display device 1 may be folded or unfolded with respect to a folding axis FX extending in the second direction DR2. The folding axis FX may be incorporated in at least one rotatable shaft. The display device 1 may include a folding area FA, a first non-folding area NFA1, and a second non-folding area NFA2.

The first non-folding area NFA1, the folding area FA, and the second non-folding area NFA2 may be arranged sequentially in the first direction DR1. The folding area FA may be an area which is bent or folded when the display device 1 is folded, and the first non-folding area NFA1 and the second non-folding area NFA2 may be areas which are not bent or folded even when the display device 1 is folded.

The display device 1 may be completely folded so that an angle between the first non-folding area NFA1 and the second non-folding area NFA2 becomes about 0° or about 360°, partially folded so that the angle between the first non-folding area NFA1 and the second non-folding area NFA2 becomes greater than about 0° and less than about 180°, or unfolded so that the angle between the first non-folding area NFA1 and the second non-folding area NFA2 becomes about 180°.

The display device 1 may be in-folded. As illustrated in FIG. 2, the term "in-folded" may denote "being folded such that an upper surface of a module in the form of a display module DM, which will be described below, is not exposed to the outside." The upper surface of the display module DM may be a surface on which an image or video is displayed. When the display device is in-folded, some of the display module DM disposed in the first non-folding area NFA1 may face other parts of the display module DM disposed in the second non-folding area NFA2. Hereinafter, an example of the display device 1, which is in-folded, is described, but the embodiments are not limited thereto. The display device 1 may also be out-folded or may be in-folded or out-folded. The term "out-folded" may denote "being folded so that the upper surface of the display module DM is exposed to the outside."

The display device 1 may include the flexible display module DM and a foldable part in the form of a foldable member FM disposed under the display module DM and supporting the display module DM. The display module DM may extend substantially across the first non-folding area NFA1, the folding area FA, and the second non-folding area NFA2 of the display device 1. The display module DM may be folded or unfolded by the foldable member FM. The display module DM may have a generally rectangular shape extending in the first direction DR1 when viewed from above but is not limited thereto.

Referring to FIGS. 1 to 3, the display module DM may include a display panel DP and a first support in the form of a support plate SP supporting the display panel DP. The display panel DP having four corners CN may display an image or video. The display panel DP may take the form of, but is not limited to a self-luminous display panel such as an organic light-emitting diode (OLED) display panel, an inorganic light-emitting (inorganic EL) display panel, a quantum dot light-emitting (QLED) display panel, a micro light emitting-diode (LED) display panel (micro-LED), a nano LED (nano-LED) display panel, a plasma display panel (PDP), a field emission display (FED) panel, or a cathode ray tube (CRT) display panel or a light-receiving display panel such as a liquid crystal display (LCD) panel or a electrophoretic display (EPD) panel.

The support plate SP may be disposed on the display panel DP and overlap the display panel DP in the thickness direction. The support plate SP may be disposed on a lower surface of the display panel DP. The lower surface of the display panel DP may be a surface opposite to an upper surface, on which an image is displayed, of the display panel DP. The support plate SP may be provided as a plate-shaped member having a generally rectangular shape when viewed from above. The support plate SP may be directly attached to the lower surface of the display panel DP but is not limited thereto.

At least a portion of the support plate SP may have flexibility so that the support plate SP may be integrally folded or unfolded with the display panel DP. The support plate SP may be formed as, for example, a thin metal plate. In the support plate SP, a pattern to facilitate folding and reduce bending stiffness may be formed in the folding area FA.

The foldable member FM may include a first body in the form of a first body frame BF1, a second body in the form of a second body frame BF2, a first cover frame CPT1, a second cover frame CPT2, and a hinge member HM. As disclosed herein, either the first body or the second body may be referred to, independently, as a body and the first cover or the second cover may be referred to, independently, as a cover. The first body frame BF1 and the second body frame BF2 may be disposed on a lower surface of the support plate SP. The first body frame BF1 may be substantially disposed in the first non-folding area NFA1, and the second body frame BF2 may be substantially disposed in the second non-folding area NFA2. The first body frame BF1 and the second body frame BF2 may be symmetrically disposed with respect to the folding area FA (folding axis FX). The first body frame BF1 and the second body frame BF2 may have substantially the same or similar structures.

The first cover frame CPT1 and the second cover frame CPT2 may be disposed in the first body frame BF1 and the second body frame BF2. The first cover frame CPT1 and the second cover frame CPT2 may cover an upper portion of the first body frame BF1 and an upper portion of the second body frame BF2, respectively. The first cover frame CPT1 and the second cover frame CPT2 may be symmetrically disposed with respect to the folding area FA (folding axis FX). The first body frame BF1 and the second body frame BF2 may have substantially the same or similar structures.

The hinge member HM may connect the first body frame BF1 and the second body frame BF2. The hinge member HM may be disposed in the folding area FA. The first body frame BF1 may be rotatably connected to one side of the hinge member HM, and the second body frame BF2 may be connected to the other side of the hinge member HM. When the display device 1 is folded, the first body frame BF1 and the second body frame BF2 may rotate in different directions about the hinge member HM.

The display device 1 may further include a bezel member BZ disposed along an edge of the display module DM. The bezel member BZ may cover a gap G (see FIG. 10) generated between the display module DM and the foldable member FM when the display device 1 is folded or unfolded.

The display device 1 may further include a first back cover BC1 (see FIGS. 7 to 10) disposed on a lower surface of the first body frame BF1 and a second back cover BC2 (see FIGS. 9 to 10) disposed on a lower surface of the second body frame BF2.

Figure 4:
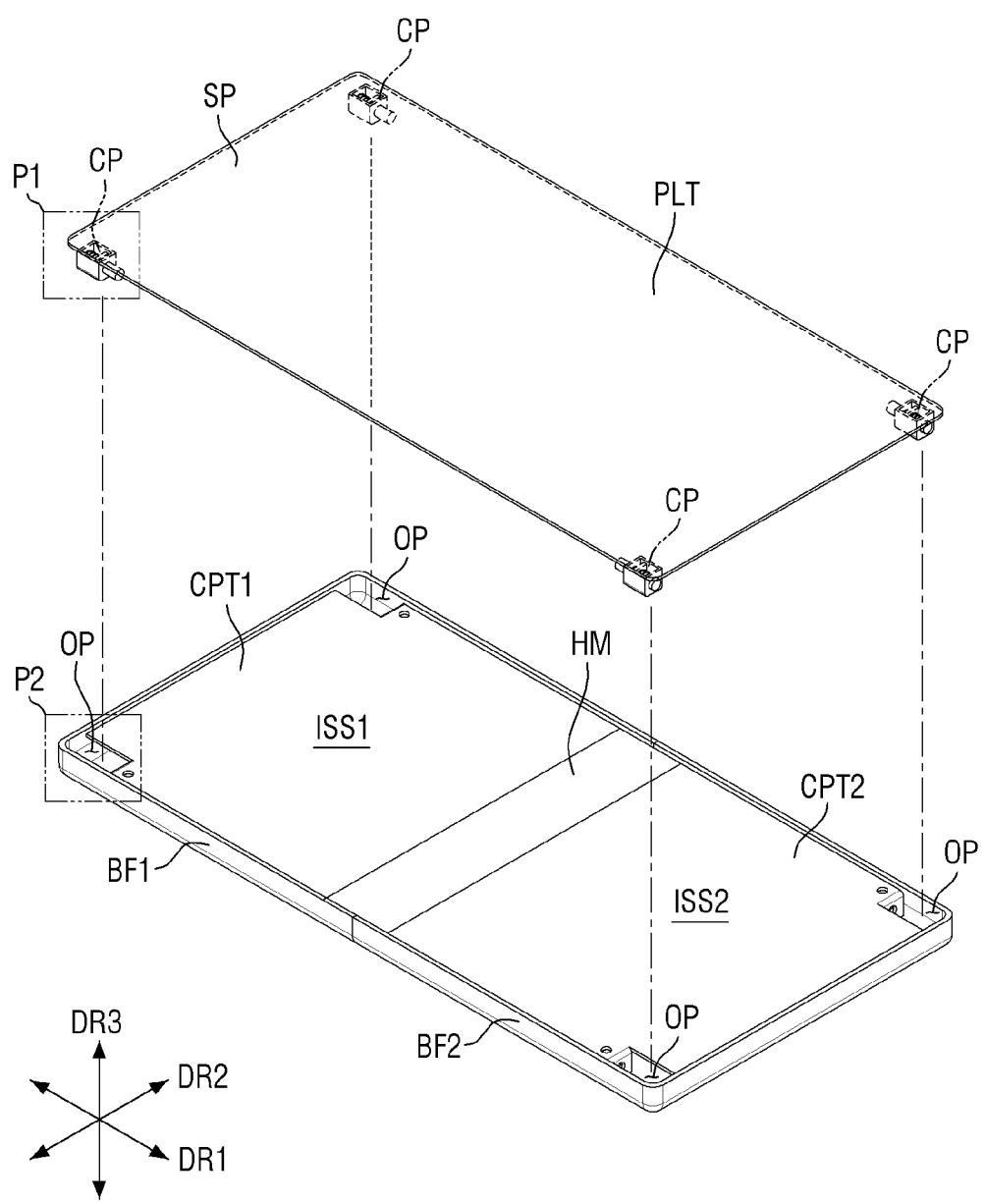
FIG. 4 is an exploded perspective view illustrating an embodiment of the support member and foldable member of the display device of FIG. 3.
Figure 5:
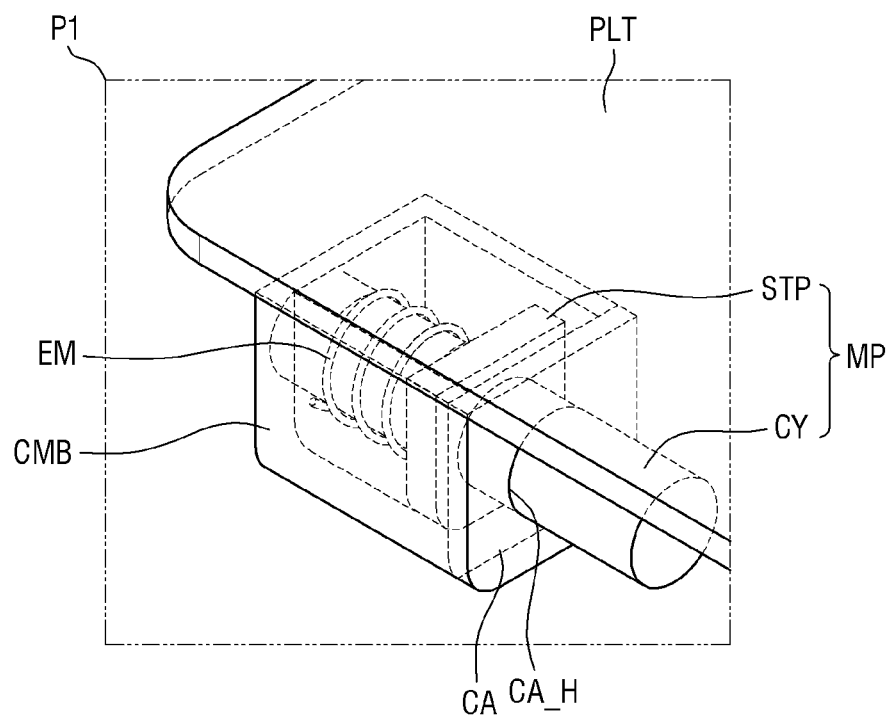
FIG. 5 is an enlarged perspective view illustrating portion P1 of FIG. 4.
Figure 5:
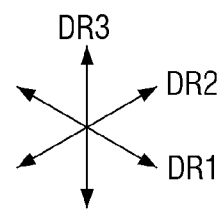
Figure 6:
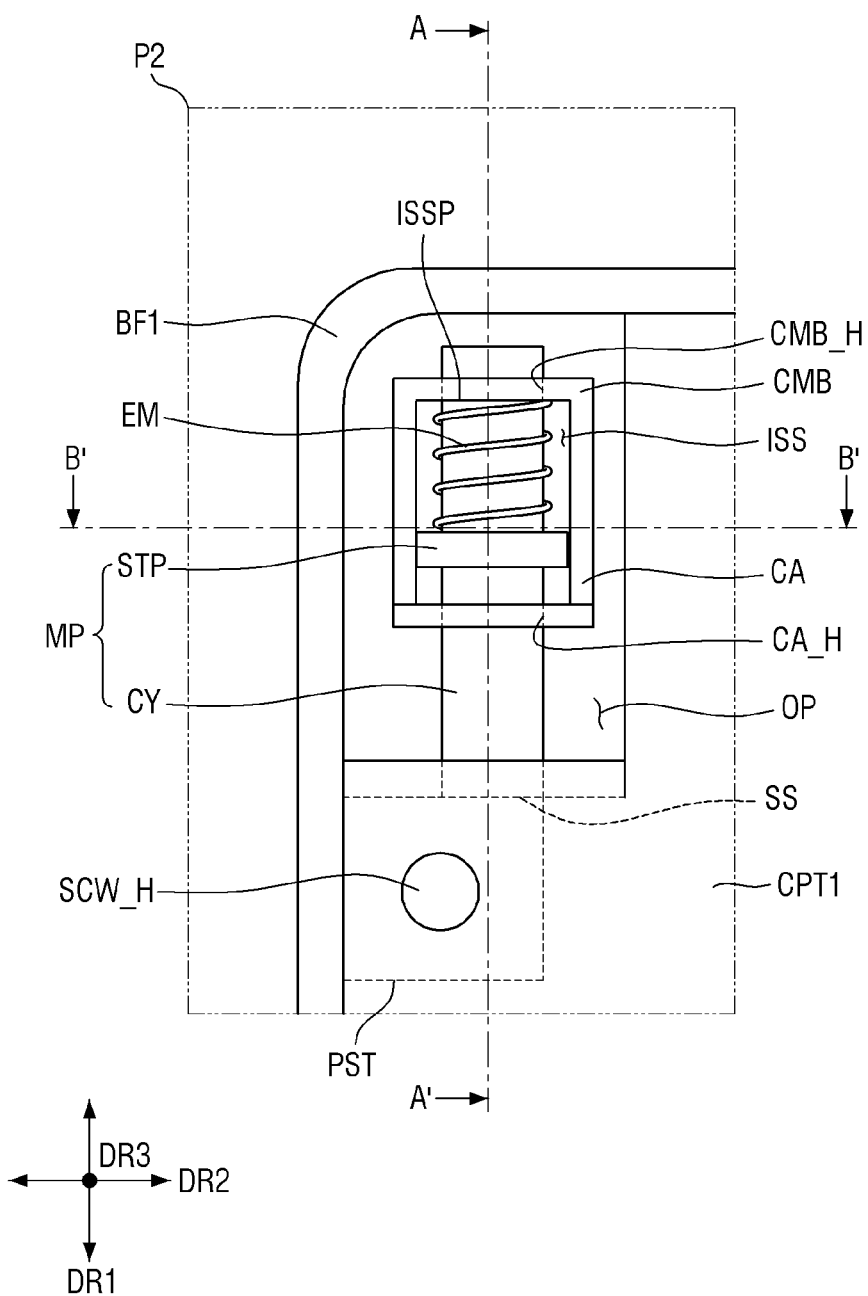
FIG. 6 is an enlarged plan view illustrating portion P2 of FIG. 4.
Figure 7:
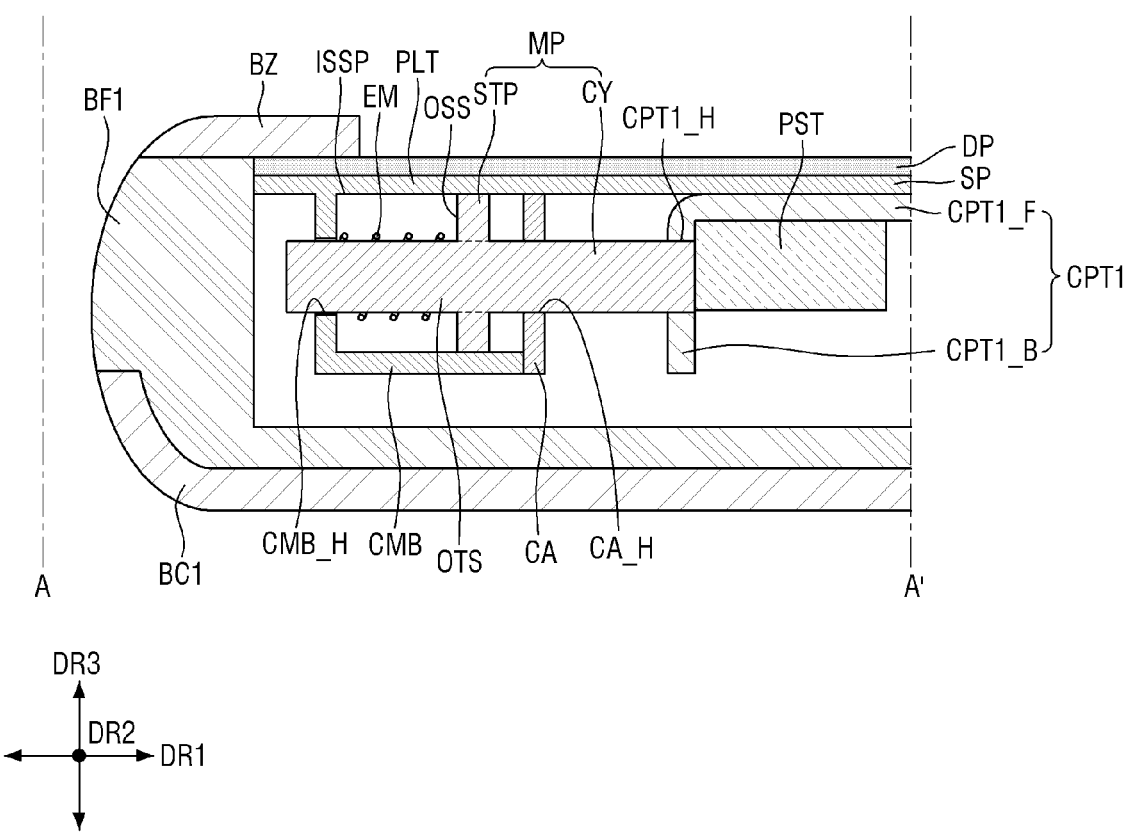
FIG. 7 is a cross-sectional view taken along line A-A' of FIG. 6.
Figure 8:
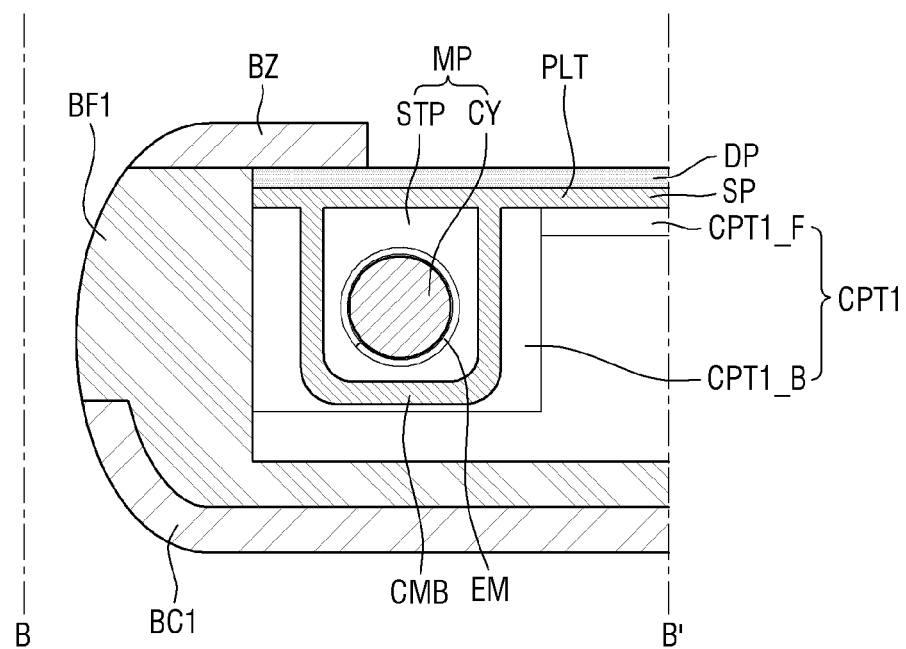
FIG. 8 is a cross-sectional view taken along line B-B' of FIG. 6.
Figure 8:
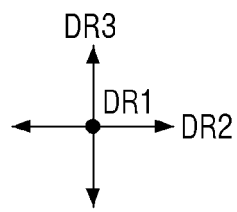

FIG. 4 is an exploded perspective view illustrating an embodiment of the support member and foldable member of the display device of FIG. 3. FIG. 5 is an enlarged perspective view illustrating portion P1 of FIG. 4. FIG. 6 is an enlarged plan view illustrating portion P2 of FIG. 4. FIG. 7 is a cross-sectional view taken along line A-A' of FIG. 6. FIG. 8 is a cross-sectional view taken along line B-B' of FIG. 6.

Referring to FIGS. 1 to 4, the support plate SP may include a plate part PLT and a plurality of couplers in the form of coupling parts CP. The plate part PLT may be disposed on the foldable member FM. As illustrated in FIGS. 3 and 4, an upper surface of the plate part PLT may face the display panel DP, and a lower surface of the plate part PLT may face the foldable member FM. The plate part PLT may be provided as a generally plate shaped member having a substantially rectangular shape when viewed from above. The plate part PLT may overlap and cover the first body frame BF1, the hinge member HM, the second body frame BF2, the first cover frame CPT1, and the second cover frame CPT2 in the thickness direction.

The plate part PLT may be directly disposed on the first cover frame CPT1, the second cover frame CPT2, and the hinge member HM. In this case, other members, for example, double-sided tape, a pressure-sensitive adhesive, an optically transparent adhesive, or an adhesive member such as a resin may not be interposed between the plate part PLT and the first cover frame CPT1, between the plate part PLT and the second cover frame CPT2, and between the plate part PLT and the hinge member HM.

That is, since the display module DM and the foldable member FM are not attached by the adhesive member or the like but are coupled by the plurality of coupling parts CP, when the display device 1 is folded, the display module DM may slidably move with respect to the foldable member FM in a direction intersecting, e.g., orthogonal to, the thickness direction. Accordingly, when the display device 1 is folded, stresses generated due to a change in the gap between the members, a change in relative position between the members, or the like may be released. The direction intersecting the thickness direction may be a direction generally parallel to an upper surface of the foldable member FM.

The plurality of coupling parts CP may be disposed on the lower surface of the plate part PLT. The plurality of coupling parts CP may protrude from the lower surface of the plate part PLT. The plurality of coupling parts CP may be disposed in edge portions of the plate part PLT. For example, as illustrated in FIG. 4, four coupling parts CP may be disposed on four corners of the plate part PLT, which generally correspond to the four corners CN of the display module DM. The four corners may be formed by two long sides which extend in the first direction DR1 meeting two short sides extending in the second direction DR2 of the plate part PLT. However, the embodiments are not limited thereto, and positions of the plurality of coupling parts CP may be variously changed. For example, the positions of the plurality of coupling parts CP may be disposed close to central portions of the short sides extending in the second direction DR2 and/or central portions of the long sides extending in the first direction DR1 of the plate part PLT or a central region of the plate part PLT.

The plurality of coupling parts CP may be inserted into a plurality of openings OP of the foldable member FM, which will be described below, to press the foldable member FM in a direction in which the hinge member HM is positioned so as to apply a tensile force to the plate part PLT and the display panel DP disposed on the plate part PLT. The first body frame BF1, the second body frame BF2, the hinge member HM, the first cover frame CPT1, and the second cover frame CPT2 may be disposed on the lower surface of the plate part PLT.

The first body frame BF1 and the second body frame BF2 may have sides which form recesses d and define inner spaces ISS1 and ISS2 (see FIGS. 4 and 7 to 10) in which electronic components are mounted.

The first cover frame CPT1 and the second cover frame CPT2 may be disposed to, respectively, cover almost all the inner spaces ISS1 and ISS2 of the first body frame BF1 and the second body frame BF2. In this case, the first cover frame CPT1 and the second cover frame CPT2 may cover, respectively, a portion of the inner space of the first body frame BF1 and a portion of the inner space of the second body frame BF2. Accordingly, a plurality of openings OP may be formed in the upper surface of the foldable member FM facing the support plate SP. The portion of the inner space ISS1 of the first body frame BF1 and the portion of the inner space ISS2 of the second body frame BF2 may be exposed upward through the plurality of openings OP. As illustrated in FIG. 4, the plurality of openings OP may be formed between the first body frame BF1 and the first cover frame CPT1 and between the second body frame BF2 and the second cover frame CPT2 but are not limited thereto. For example, the plurality of openings OP may be formed to penetrate through the first cover frame CPT1 or the second cover frame CPT2.

The plurality of openings OP may be formed at positions facing a plurality of protrusions CMB projecting downwardly from the support plate PLT as discussed in connection with FIG. 5. The plurality of openings OP may receive the plurality of protrusions CMB. As illustrated in FIG. 4, the plurality of four openings OP may be formed in four corners of the upper surface of the foldable member FM. However, the plurality of openings OP are not limited thereto and may be disposed close to the long sides extending in the first direction DR1 and/or the short sides extending in the second direction DR2 of the foldable member FM.

Hereinafter, corner portions P1 and P2 (see FIG. 4) illustrated at a left side in the FIG. 4 will be mainly described of the corner portions, which are disposed in the first non-folding area NFA1, of the display device 1. Other corner portions of the display device 1 may also substantially have the same or a similar structure of the corner portion of the left upper end of the display device 1, so such descriptions will be omitted to avoid redundancy. For example, both corners of the first non-folding area NFA1 may have a symmetrical structure with respect to an arbitrary axis bisecting the display device 1 in the first direction DR1, and both corners of the first non-folding area NFA1 and both corners of the second non-folding area NFA2 may have a symmetrical structure with respect to the hinge member HM and/or folding axis FX (see FIG. 1).

Referring to FIGS. 5 and 6, the coupling part CP may include a housing in the form of the protrusion CMB, a movable part in the form of a movable member MP, and an elastic part in the form or elastic member EM. The protrusion CMB may be disposed on the corner of the plate part PLT and may be formed to project downwardly from the lower surface of the plate part PLT. As illustrated in FIG. 6, the protrusion CMB may be received in the opening OP formed between the first cover frame CPT1 and the first body frame BF1.

The protrusion CMB may have an inner space ISS of which one side is open. At least a portion of the movable member MP and the elastic member EM may be received in the protrusion CMB. The protrusion CMB may denote a chamber of which one side is open and which receives the portion of the movable member MP and the elastic member EM. The coupling part CP may further include a capping member CA which covers one open side of the protrusion CMB. The protrusion CMB and the capping member CA may include a first through hole CMB_H and a second through hole CA_H through which the movable member MP passes. The first through hole CMB_H and the second through hole CA_H may be arranged in a linear direction of the movable member MP along its longitudinal axis to guide the sliding movement of the movable member MP. The diameter of the first through hole CMB_H and the diameter of the second through hole CA_H may be greater than or equal to a diameter of a substantially cylindrically-shaped portion of a cylinder part CY, which forms part of the movable member MP. The size of the first through hole CMB_H and a size of the second through hole CA_H may be less than a size of a stopper part STP.

The movable member MP may be slidably supported by and movably coupled to the protrusion CMB. The movable member MP may be inserted into the protrusion CMB. The movable member MP may be a generally rod or pin shaped member of having an outer circumferential surface extending in a radial direction. The movable member MP may include the cylinder part CY and the stopper part STP.

The cylinder part CY may have a generally cylindrical shape extending in the first direction DR1. A portion of the cylinder part CY may be received in the protrusion CMB, and both ends thereof may be exposed to the outside of the protrusion CMB. When the display panel DP is folded, the exposed length of each of the ends of the cylinder part CY may be changed.

The stopper part STP may extend outwardly from an outer circumferential surface of the cylinder part CY. The stopper part STP may be received in the protrusion CMB. When the elastic member EM is elongated, the stopper part STP may come into contact with the capping member CA to restrict the movable distance of the movable member MP.

Referring to FIGS. 5, 6, 7, and 8, as described above, the first body frame BF1 may include the inner space ISS1, which, may be covered by the first cover frame CPT1. A portion of the inner space close to a corner of the first body frame BF1 may not be covered by the first cover frame CPT1 so as to form the opening OP. The opening OP may be covered by the plate part PLT. The protrusion CMB may be received in the inner space ISS1 of the first body frame BF1 through the opening OP. The first cover frame CPT1 may include a generally flat part CPT1_F and a bent part CPT1_B, as shown in FIG. 7.

The generally flat part CPT1_F may be disposed on the lower surface of the plate part PLT. The generally flat part CPT1_F may be provided as a generally plate shaped member generally parallel to the first direction DR1 and the second direction DR2. When viewed in a cross section, the generally flat part CPT1_F may flatly extend in a substantially horizontal direction to cover the inner space of the first body frame BF1. The generally flat part CPT1_F may not be disposed at a corner portion of the first body frame BF1 so that the opening OP is formed therein. For example, a corner portion of the generally flat part CPT1_F may be recessed inward from the generally flat part CPT1_F so that an edge thereof has a generally L shape when viewed from above. A lower surface of the generally flat part CPT1_F may be seated on an upper surface of a second support in the form of a support part PST. A portion of the generally flat part CPT1_F may be interposed between the support part PST and the plate part PLT.

The bent part CPT1_B may be connected to the generally flat part CPT1_F, be bent from the generally flat part CPT1_F, and extend in the third direction DR3. The third direction DR3 may be a substantially vertical direction. The inner space of the first body frame BF1 may not be completely covered by the first cover frame CPT1, and the opening OP accommodating the protrusion CMB and the movable member MP may be formed between an inner side surface forming the inner space ISS1 of the first body frame BF1 and the bent part CPT1_B.

The bent part CPT1_B may be disposed on a side surface of the protrusion CMB extending in the third direction DR3. A third through hole CPT1_H through which the movable member MP passes may be formed in the bent part CPT1_B, and the movable member MP may be in direct contact with the side surface of the protrusion CMB through the third through hole CPT1_H. In this case, since the bent part CPT1_B has a predetermined thickness, the third through hole CPT1_H may fix a position of an end portion of the movable member MP in contact with the support part PST. Since an upper surface of a portion in which the bent part CPT1_B and the generally flat part CPT1_F are connected includes a generally curved surface having a generally convex curvature outward, the display module DM and the foldable member FM may be easily assembled.

The support part PST may be disposed under the generally flat part CPT1_F.

The support part PST may be in direct contact with the lower surface of the generally flat part CPT1_F to support the generally flat part CPT1_F. The support part PST may support one side of the movable member MP. The support part PST may restrict movement of the movable member MP in the first direction DR1. The first direction DR1 may a direction toward the hinge member HM. The support part PST may fix the relative position of the movable member MP with respect to the foldable member FM (first body frame BF1) so that a tensile force may be applied to the plate part PLT and the display panel DP disposed on the plate part PLT due to the restoring force of the elastic member EM. When the display device 1 is folded, the relative position of the movable member MP with respect to the display module DM (protrusion CMB) may be changed to relieve stress and minimize creases due to folding.

As illustrated in FIG. 6, the foldable member FM may further include a coupling hole SCW_H penetrating through the support part PST and the generally flat part CPT1_F in the thickness direction. A coupling member such as a screw may be inserted into the coupling hole SCW_H to fix the first cover frame CPT1 to the first body frame BF1. However, the embodiments are not limited thereto, and the first cover frame CPT1 and the first body frame BF1 may be coupled together in one of various manners.

The elastic member EM may be received in the protrusion CMB. The elastic member EM may be interposed between an inner side surface ISSP of the protrusion CMB and the stopper part STP of the movable member MP. One side OSS of the elastic member EM may be supported by the inner side surface ISSP forming the inner space ISS of the protrusion CMB, and the other side OTS of the elastic member EM may be supported by the stopper part STP. One side SS of the movable member MP may be supported by the support part PST, and the elastic member EM may push an inner sidewall of the protrusion CMB in a direction away from the hinge member HM (depicted in FIG. 4). Accordingly, a tensile force may be applied to the plate part PLT integrally connected to the protrusion CMB and the display panel DP attached to the plate part PLT to reduce creasing dur to folding and unfolding of the display.

The elastic member EM may be provided as a part formed of an elastic material capable of providing a restoring force. For example, the elastic member EM may be a spring. The other side of the movable member MP may pass through the spring so that the spring may surround the outer circumferential surface of the movable member MP.

The elastic member EM may be received in the protrusion CMB in a state in which the elastic member EM is compressed to provide a predetermined restorative force. In this case, the elastic member EM may always provide the restorative force to elongate the display panel DP regardless of folding of the display device 1. That is, the display device 1 according to one embodiment may allow the tensile force to be continuously applied to the display panel DP so that folding creases of the display panel DP due to repeated folding may be reduced.

Figure 9:
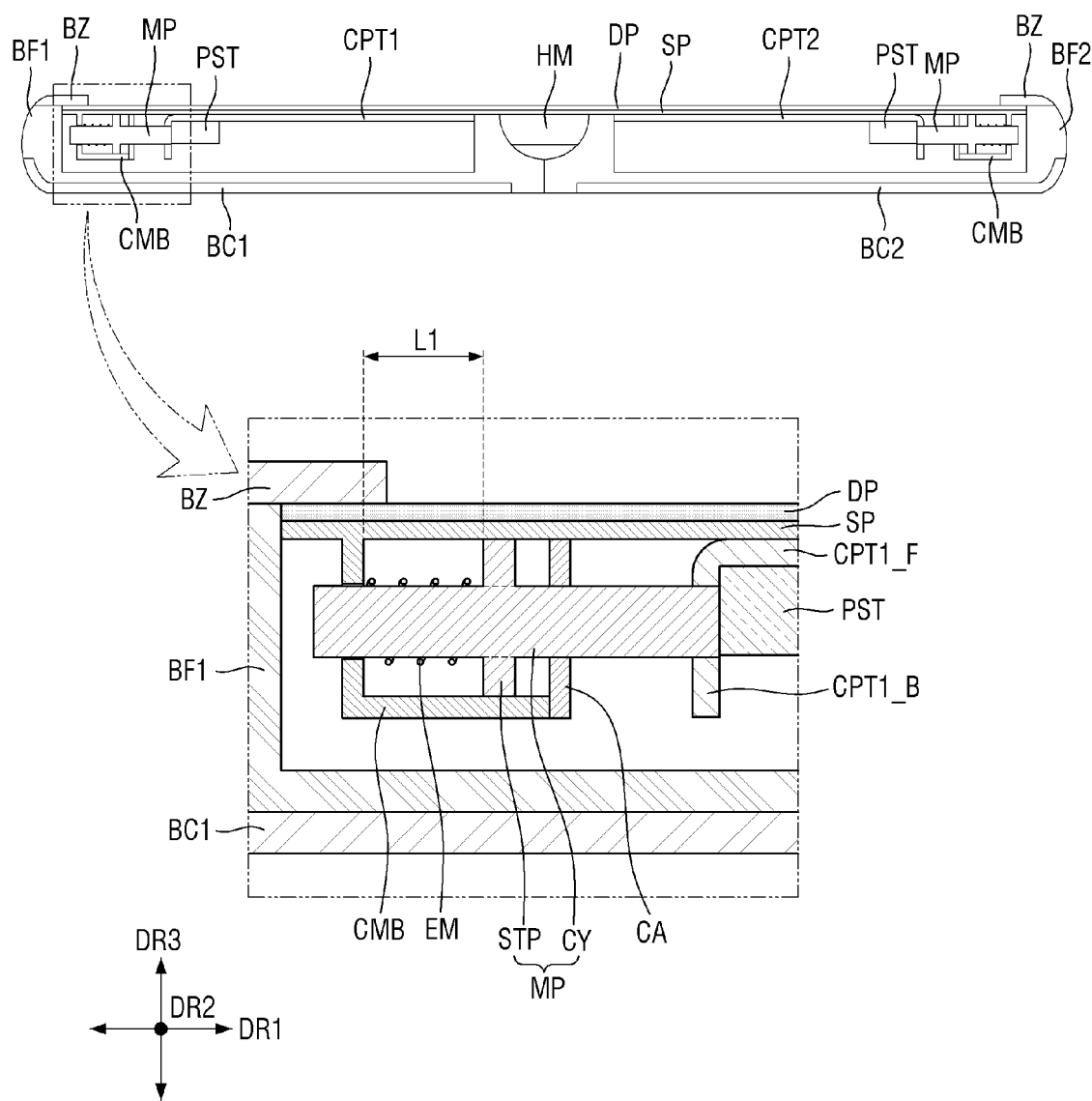
FIG. 9 is a cross-sectional view with an enlarged callout illustrating an embodiment of an elastic member when the display device is in an unfolded position.
Figure 10:
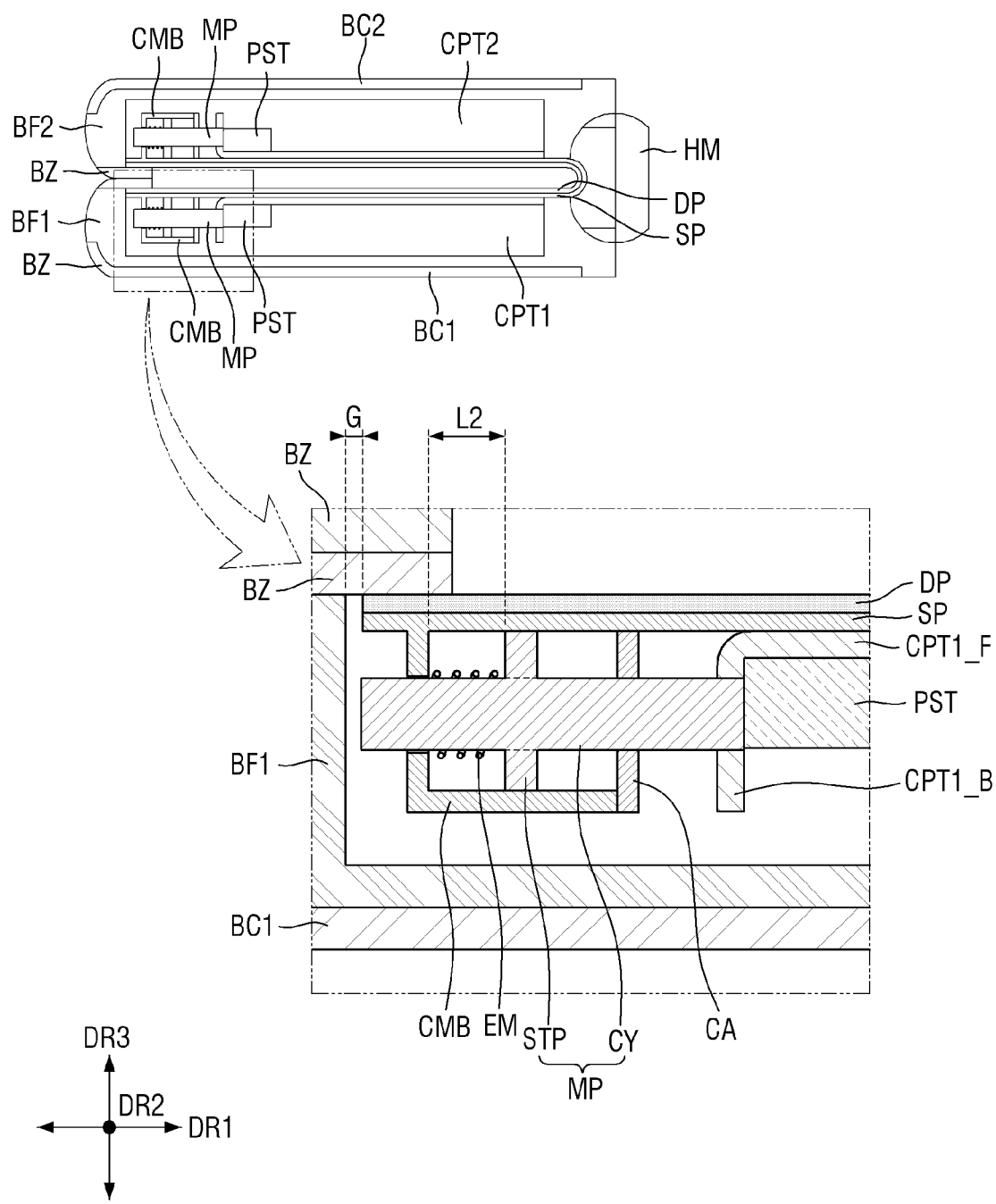
FIG. 10 is a cross-sectional view with an enlarged callout illustrating an embodiment of an elastic member when the display device is in an unfolded position.

FIG. 9 is a cross-sectional view with an enlarged callout illustrating an embodiment of an elastic member when the display device is in an unfolded position. FIG. 10 is a cross-sectional view with an enlarged callout illustrating an embodiment of an elastic member when the display device is in an unfolded position. Repetitive descriptions of elements discussed above will be omitted to avoid redundancy.

Referring to FIGS. 9 and 10, when the display device 1 is folded or unfolded, the movable member MP may slidably move with respect to the protrusion CMB in the first direction DR1. The first direction DR1 may be a direction intersecting the thickness direction. The first direction DR1 may be a direction substantially parallel to a direction in which the upper surface (lower surface) of the display panel DP extends.

In a case in which a unfolded state of the display device 1 is changed into a folded position or state thereof, the movable member MP may move in a direction opposite to a direction in which the hinge member HM is positioned and/or in which the elastic member EM is compressed. In a case in which the folded state of the display device 1 is changed to the unfolded position or state thereof, the movable member MP may move in the direction in which the hinge member HM is positioned and/or in which the elastic member EM is elongated.

When the display device 1 is folded or unfolded, the length of the elastic member EM retained in the protrusion CMB may be changed. For example, as illustrated in FIGS. 9 and 10, in a case in which the display device 1 is in the unfolded state, the elastic member EM has a first length L1, and in a case in which the display device 1 is in the folded state, the elastic member EM may have a second length L2, less than the first length L1, as the elastic member is compressed and the moving member MP has a greater length extending outside the protrusion CMB. That is, the length of the elastic member EM may be reduced when the display panel DP is folded and may be elongated when the display device 1 is unfolded. According to a specific configuration of the display device 1, the second length L2 may be greater than the first length L1.

Referring to FIG. 10, as described above, when the display device 1 is folded, the display module DM may be slidably moved by a small distance with respect to the foldable member FM. In this case, the gap G may be formed between the edge of the display module DM (display panel DP) and the foldable member FM (inner side surface of the first body frame BF1). The bezel member BZ may be disposed across the display panel DP and the first body frame BF1 to cover the gap G. According to a further embodiment of the display device 1, the gap G may be formed when the display device 1 is unfolded.

Display devices having a foldable display panel constructed according to the principles and embodiments of the invention can reduce folding creases, which are generated due to repeated folding.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
    a display panel;
    a first support disposed on the display panel and including a housing, a movable part supported for slidable movement relative to the housing, and an elastic part having one side supported by the housing to press the movable part;
    a body disposed on the first support and including an inner space overlapping the first support and a second support disposed in the inner space and supporting one side of the movable part,
    wherein the display panel includes a folding axis extending in a direction, wherein the second support is disposed between the one side of the movable part and the folding axis,
    wherein the movable part comprises a movable member having a cylindrically-shaped portion and a stopper part extending from the cylindrically-shape portion,
    the housing comprises a protrusion including a region accommodating the elastic part and an inner side surface surrounding the inner space,
    one side of the elastic part is supported by an inner side surface of the protrusion, and
    another side of the elastic part is supported by the stopper portion.

2. The display device of claim 1, wherein the first support comprises a first support plate and the housing comprises a plurality of housings disposed at corners of the first support plate.

3. The display device of claim 1, wherein, when the display panel is folded with respect to the folding axis, the movable part slidably moves with respect to the housing in a direction intersecting the thickness direction of the display device.

4. The display device of claim 1, wherein the second support comprises a support part and the movable part comprises a movable member:
    the one side of the movable part extends from the housing toward the second support part; and
    when the display panel is folded with respect to the folding axis, a length of the one side of the movable member protruding from the housing increases or decreases.

5. The display device of claim 1, further comprising a cover member overlapping the inner space of the body.

6. The display device of claim 5, wherein the first support comprises a support plate and is in direct contact with the cover frame.

7. The display device of claim 6, wherein, when the display panel is folded with respect to the folding axis, the support plate slidably moves with respect to the cover frame.

8. The display device of claim 1, wherein the elastic part comprises an elastic member that is compressible by the movable part to provide a restorative force to elongate the first support.

9. The display device of claim 1, wherein, when the display panel is folded with respect to the folding axis, a length of the elastic part is changed.

10. The display device of claim 9, wherein:
    the elastic part is compressed when the display panel is folded; and
    the elastic part is elongated when the display panel is unfolded.

11. The display device of claim 1, further comprising a bezel member disposed at least partially on an edge of the display panel.

12. The display device of claim 11, wherein, when the display panel is folded with respect to the folding axis:
    a gap is formed between the display panel and the body; and
    the gap is covered by the bezel.

13. A display device comprising:
    a display panel;
    a first support disposed on the display panel and including a housing, a movable part supported for slidable movement relative to the housing, and an elastic part having one side supported by the housing to press the movable part;
    a body disposed on the first support and including an inner space overlapping the first support and a second support disposed in the inner space and supporting one side of the movable part; and
    a cover frame overlapping the inner space of the body,
    wherein the body comprises a body frame and the cover frame comprises:
    a flat part interposed between the first support and the second support; and
    a bent part connected to the flat part and bent to form an opening accommodating the housing between the cover frame and the body frame.

14. The display device of claim 13, wherein the housing is received through the opening in the inner space of the body frame.

15. The display device of claim 13, further comprising a coupling hole formed through the second support and the flat part.

16. A display device comprising:
    a display module including a display panel and a plurality of couplers overlapping corners of the display panel; and
    a foldable part disposed on the display module and including a plurality of support parts in contact with the plurality of couplers,
    wherein the plurality of couplers press the plurality of support parts to apply a tensile force to the display panel,
    wherein at least one of the plurality of couplers comprises a housing, a movable part supported for slidable movement relative to the housing, and an elastic part having one side supported by the housing and pressing the movable part, and
    an entire surface of one side of the movable part is supported by one of the support parts,
    wherein the display panel includes a folding axis extending in a direction,
    wherein the one of the support parts is disposed between the one side of the movable part which is supported by the one of the support parts and the folding axis, wherein the movable part comprises a movable member having a cylindrically-shaped portion and a stopper part extending from the cylindrically-shape portion, the housing comprises a protrusion including a region accommodating the elastic part and an inner side surface surrounding the inner space, one side of the elastic part is supported by an inner side surface of the protrusion, and another side of the elastic part is supported by the stopper portion.

17. The display device of claim 16, wherein the foldable part comprises a foldable member and the display module slidably coupled to the foldable member for movement relative to the foldable member when the display panel is folded with respect to the folding axis.

* * * * *